(12) United States Patent
Tseng et al.

(10) Patent No.: US 9,758,721 B2
(45) Date of Patent: Sep. 12, 2017

(54) CORE-SHELL FLUORESCENT MATERIAL AND A LIGHT SOURCE DEVICE INCLUDING THE SAME

(71) Applicant: CHINA GLAZE CO., LTD. (TAIWAN), Hsinchu (TW)

(72) Inventors: Chia-Hung Tseng, Taipei (TW); Yi-Cheng Chiu, Hsinchu (TW); Sung-Yu Tsai, Hsinchu (TW); Hsien-Chung Tsai, Hsinchu (TW)

(73) Assignee: CHINA GLAZE CO., LTD. (TAIWAN), Hsinchu (TW)

( * ) Notice: Subject to any disclaimer, the term of this patent is extended or adjusted under 35 U.S.C. 154(b) by 133 days.

(21) Appl. No.: 14/667,034

(22) Filed: Mar. 24, 2015

(65) Prior Publication Data

US 2016/0281962 A1 Sep. 29, 2016

(51) Int. Cl.
*F21V 9/16* (2006.01)
*H01J 1/63* (2006.01)
*F21K 99/00* (2016.01)
*C09K 11/77* (2006.01)

(52) U.S. Cl.
CPC ...... *C09K 11/7734* (2013.01); *C09K 11/7774* (2013.01); *H01J 1/63* (2013.01)

(58) Field of Classification Search
CPC .. H01L 33/502; F21V 9/16; F21V 9/56; H01J 1/63; C09K 11/7774; C09K 11/7754
See application file for complete search history.

(56) References Cited

U.S. PATENT DOCUMENTS

| 7,497,973 B2* | 3/2009 | Radkov | C09K 11/617 252/301.4 F |
| 7,847,309 B2* | 12/2010 | Radkov | C09K 11/675 252/301.4 R |
| 2014/0320788 A1* | 10/2014 | Weiler | H01L 33/502 349/71 |

* cited by examiner

*Primary Examiner* — Carol M Koslow
(74) *Attorney, Agent, or Firm* — Rabin & Berdo, P.C.

(57) ABSTRACT

A core-shell fluorescent material and a light source device using the same are disclosed. The core-shell fluorescent material includes a core and a shell for generating an emitting light with wavelength within 520 and 800 nm after absorbing an exciting light with wavelength within 370 and 500 nm. The core may include yellow, green or red fluorescent powder, and the shell includes manganese (IV)-doped fluoride compound. The light source device generally includes the core-shell fluorescent material, a radiation source, leads and a package. The leads provide current to the radiation source and cause the radiation source to emit radiation. The core-shell fluorescent material is coated on the package for receiving the radiation so as to generate a high quality emission served as the desired light source for the field of lighting and displaying.

6 Claims, 9 Drawing Sheets

CORE-SHELL FLUORESCENT MATERIAL AND A LIGHT SOURCE DEVICE INCLUDING THE SAME

BACKGROUND OF THE INVENTION

1. Field of the Invention

The present invention generally relates to a core-shell fluorescent material and a light source device using the same, and more specifically to a core-shell fluorescent material comprising a core having yellow, green or red fluorescent powder and a shell having manganese (IV)-doped fluoride compound specified by a chemical formula $A_xMF_{6-y}Z_y:Mn^{4+}$, such that the core-shell fluorescent material may absorb the blue light to generate white light with high color rendering index.

2. The Prior Arts

In recent years, there has been considerable interest in white light-emitting diodes (wLEDs) owing to their long operation lifetime, low energy consumption, high material stability, and environmentally friendly characteristics. Hence, white LEDs are promising candidate to replace conventional incandescent and fluorescent lamps. One of indispensable materials for manufacturing LEDs is the fluorescent material for light conversion, which is strongly related to LEDs' luminous efficiency, stability, color rendering, color temperature and lifetime, especially for the white light LED system using the integrated single chip.

In general, a white light device needs high color rendering to show the true color of the object. White light can be generated by a combination of blue LED chips coated with the yellow-emitting phosphor $Y_3Al_5O_{12}:Ce^{3+}$ (YAG:$Ce^{3+}$) or green-emitting phosphor $Lu_3Al_5O_{12}:Ce^{3+}$ (LuAG:$Ce^{3+}$). Nevertheless, the drawbacks of this method include a low-rendering index and high color temperature due to the deficiency of red emission in the visible spectrum.

Therefore, it is greatly needed for a new core-shell fluorescent material with hybrid spectrum and a new light source device using the core-shell fluorescent material. The core-shell fluorescent material can be used as one single fluorescent powder for packaging so as to effectively increase color rendering for white light. The core-shell fluorescent material comprises a core having yellow, green or red fluorescent powder, and a shell having manganese (IV)-doped fluoride compound such that an exciting light with wavelength range of 400-460nm is converted into an emitting light with wavelength in the 520-800nm range. The light source device manufactured by use of the core-shell fluorescent material provides high quality light source, thereby overcoming the above problem in the prior arts.

SUMMARY OF THE INVENTION

The primary object of the present invention is to provide a core-shell fluorescent material that emits light having a peak wavelength ranging from 520 to 800nm when excited by visible light ranging from 400 to 460nm, comprising a core material and a shell material coated on the core. The core material comprises at least one of yellow, green and red fluorescent powder, and the shell material comprises a manganese (IV)-doped fluoride compound. The manganese (IV)-doped fluoride compound is specified by a chemical formula $A_xMF_{6-y}Z_y:Mn^{4+}$ to provide said core-shell fluorescent material, when x=1, 0≤y≤6, A is at least one of Mg, Ca, Sr, Ba, or combinations thereof and, when x=2, 0≤y≤6, A is at least one of Li, Na, K, Rb, Cs, or combinations thereof; M is selected from Si, Ge, Sn, Ti, Zr, or combinations thereof; F is fluorine, Z is at least one of Cl, Br, I, or combinations thereof; and $Mn^{4+}$ represents the tetravalent manganese ion.

The manganese (IV)-doped fluoride compound of the shell could be efficiently excited in the range of 400-460nm and presented narrow lines between 520 and 800nm which can further collocate appropriate fluorescent materials for the application field of lighting or liquid crystal display (LCD), thereby providing light source with specific spectrum such as white light source.

Additionally, the fluorescent powder of the core comprises at least one of a trivalent cerium-doped ($Ce^{+3}$) metal oxide and a divalent europium-doped ($Eu^{+2}$) compound. The trivalent cerium-doped ($Ce^{+3}$) metal oxide is specified by a chemical formula $(Y, Gd, Tb, La, Sm, Pr, Lu)_3(Sc, Al, Ga)_5O_{12}:Ce^{+3}$. The divalent europium compound comprises at least one of $(Sr, Ca)Si_2O_2N_2:Eu^{+2}$, Alpha-SiAlON:$Eu^{+2}$, Beta-SiAlON:$Eu^{+2}$, $(Ba, Sr, Ca)_2SiO_4:Eu^{+2}$, $(Ba, Sr, Ca)_2Si_5N_8:Eu^{+2}$, $(Ca, Sr)AlSiN_3:Eu^{+2}$. In particular, the core has a particle size within 0.01 μm and 200 μm.

Another objective of the present invention is to provide a light source device comprising the core-shell fluorescent material, radiation source, leads and a package. The leads provide current to the radiation source and cause the radiation source to emit radiation. The core-shell fluorescent material is coated on the package for receiving the radiation so as to generate a high quality emission. Particularly, the light source device of the present invention may comprise at least one of yellow, green and red fluorescent materials for receiving radiation from the radiation source and emitting yellow light, green light and red light, respectively. Additionally, the yellow, green and red fluorescent materials are homogeneously mixed and coated on the package such that the specific emitting light is adjusted and serves as a high quality light source for the field of lighting and displaying. The light source device may comprise at least one of the yellow, green or red fluorescent powder(s), wherein the fluorescent materials are dispersed with an encapsulant to provide the core-shell fluorescent materials and are coated on the package or the radiation source to generate a colored light having a specific spectrum. The colored light may have a white light spectrum.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The present invention may be embodied in various forms and the details of the preferred embodiments of the present invention will be described in the subsequent content with reference to the accompanying drawings. The drawings (not to scale) show and depict only the preferred embodiments of the invention and shall not be considered as limitations to the scope of the present invention. Modifications of the shape of the present invention shall too be considered to be within the spirit of the present invention.

Figure 1:
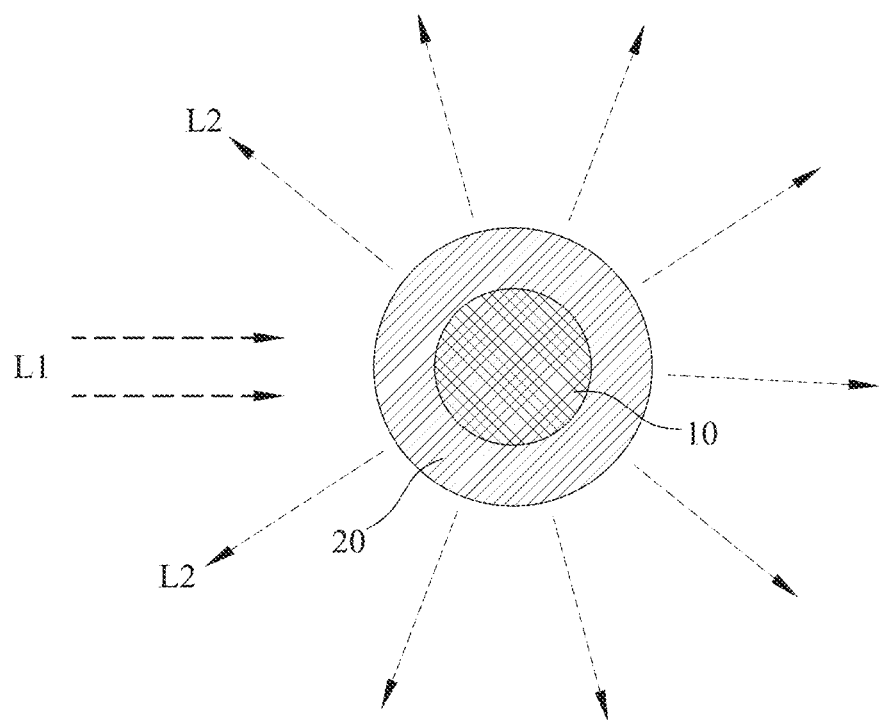
FIG. 1 shows core-shell fluorescent material according to one embodiment of the present invention.

Please refer to FIG. 1 illustrating the core-shell fluorescent material according to one embodiment of the present invention. As shown in FIG. 1, the core-shell fluorescent material 1 of the present embodiment is generally a kind of phosphor in a form of particle or powder, and specifically comprises a core 10 and a shell 20 coated on the core 10. The core 10 preferably has a particle size within 0.01 μm and 200 μm and comprises yellow, green or red fluorescent powder, and the shell 20 comprises manganese (IV)-doped fluoride compound.

Overall speaking, the core-shell fluorescent material 1 of the present invention can be excited by the visible light L1 with wavelength within 400nm to 460nm, and then generates the emitting light L2 with peak wavelength within 520 nm and 800nm, which is applicable to the light source for lighting or display device.

More specifically, the yellow, green or red fluorescent powder of the core 10 may comprise at least one of a trivalent cerium-doped ($Ce^{+3}$) metal oxide and a divalent europium-doped ($Eu^{+2}$) compound. The trivalent cerium-doped metal oxide is specified by a chemical formula (Y, Gd, Tb, La, Sm, Pr, Lu)$_3$(Sc, Al, Ga)$_5$O$_{12}$:$Ce^{+3}$. The divalent europium compound comprises at least one of (Sr, Ca)$Si_2O_2N_2$:$Eu^{+2}$, Alpha-SiAlON:$Eu^{+2}$, Beta-SiAlON:$Eu^{+2}$, (Ba, Sr, Ca)$_2$SiO$_4$:$Eu^{+2}$, (Ba, Sr, Ca)$_2$Si$_5$N$_8$:$Eu^{+2}$, (Ca, Sr)AlSiN$_3$:$Eu^{+2}$.

Specifically, the manganese (IV)-doped fluoride compound of the shell 20 is specified by a chemical formula $A_xMF_{6-y}Z_y$:$Mn^{4+}$, when x=1, 0≤y≤6, A is at least one of Mg, Ca, Sr, Ba, or combinations thereof, when x=2, 0≤y≤6, A is at least one of Li, Na, K, Rb, Cs, or combinations thereof; M is selected from Si, Ge, Sn, Ti, Zr, or combinations thereof; F is the fluorine, Z is at least one of Cl, Br, I, or combinations thereof; and $Mn^{4+}$ represents the tetravalent manganese ion.

Figure 2:
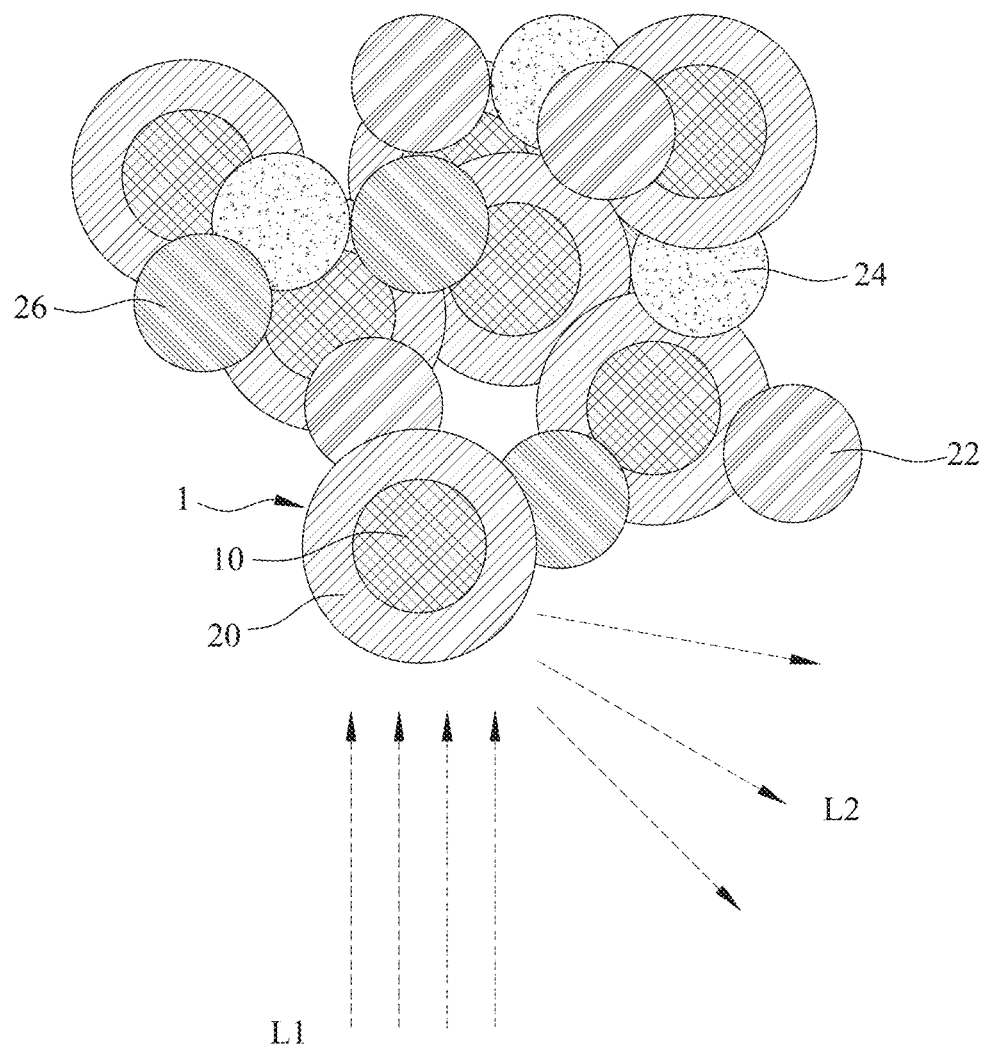
FIG. 2 shows the core-shell fluorescent material mixed the yellow, green and red fluorescent materials according to the present invention.

To further adjust the spectrum of the emitting light L2 to form hybrid light for a specific spectrum like white light, please refer to FIG. 2 showing the core-shell fluorescent material mixed with the yellow, green and red fluorescent materials according to the present invention. In other words, the present invention may further comprise at least one of the yellow fluorescent material 22, the green fluorescent material 24 and the red fluorescent material 26, which receive the exciting light L1 and then emit yellow, green and red light, respectively.

More specifically, the above yellow fluorescent material 22 comprises at least one of $Y_3Al_5O_{12}$:$Ce^{+3}$, Alpha-SiAlON:$Eu^{+2}$ or (Ba, Sr, Ca)$_2$SiO$_4$:$Eu^{+2}$.

The green fluorescent material comprises at least one of $Lu_3Al_5O_{12}$:$Ce^{+3}$, Beta-SiAlON:$Eu^{+2}$ or (Sr, Ca)$Si_2O_2N_2$:$Eu^{+2}$. The red fluorescent material comprises at least one of (Ba, Sr, Ca)$_2$Si$_5$N$_8$:$Eu^{+2}$ or (Ca, Sr)AlSiN$_3$:$Eu^{+2}$.

Figure 3:
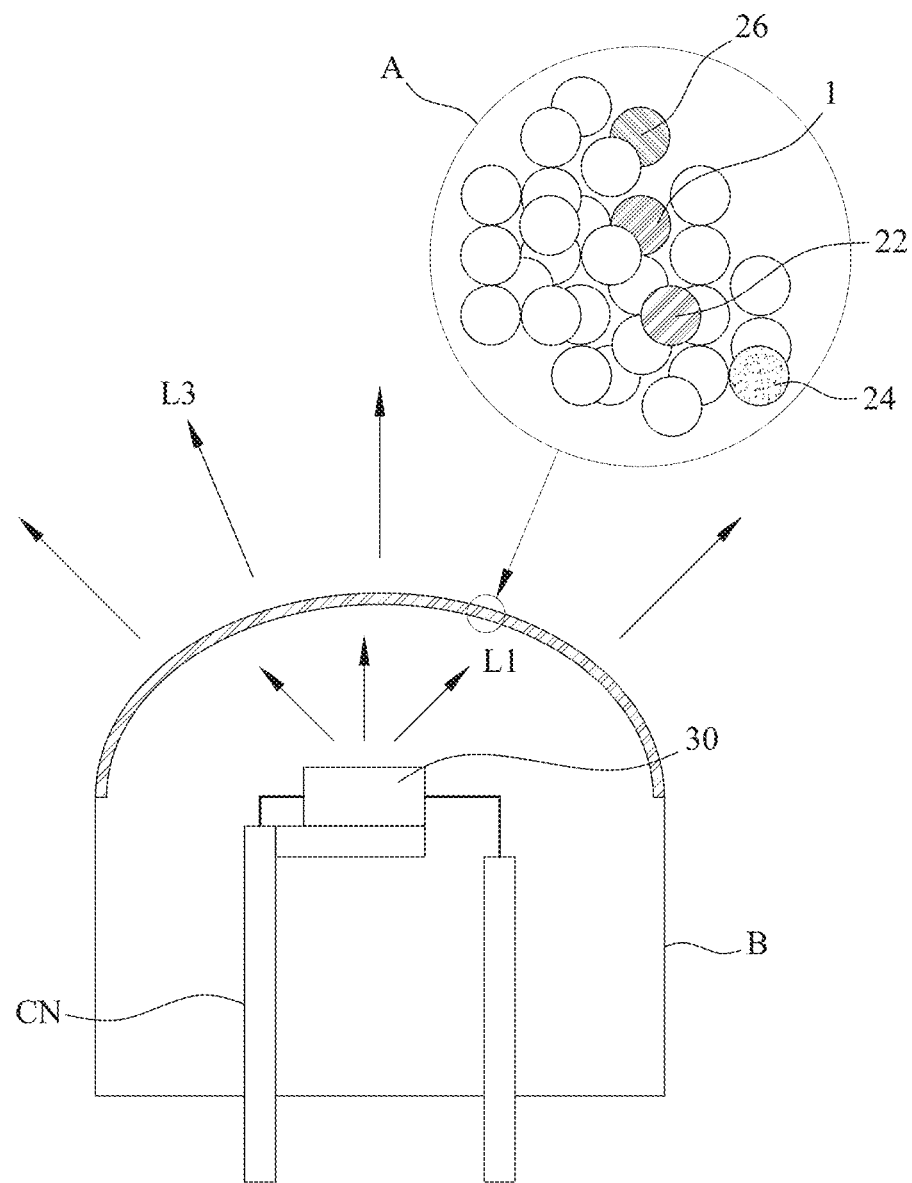
FIG. 3 shows the light source device according to another embodiment of the present invention.

Further refer to FIG. 3 showing the light source device according to another embodiment of the present invention. The light source device 2 of the present embodiment generally comprises the core-shell fluorescent material 1, a radiation source 30, the leads CN and a package B. Symbol A is an enlarged view of a top portion of package B.

The leads CN provide current to the radiation source 30 so as to generate the radiation light L1, and the core-shell fluorescent material 1 is coated on the package B for receiving the radiation light L1 to generate emission L3 such as white light.

The package B encloses the radiation source 30 and the leads CN for protection, and is generally formed of highly transparent and electrically insulating resin or glass.

The feature of the core-shell fluorescent material 1 of the present embodiment is similar to the embodiment in FIGS. 1 and 2, and the detailed description is thus omitted.

Accordingly, the light source device 2 of the present embodiment may comprise at least one of the yellow fluorescent material 22, the green fluorescent material 24 and the red fluorescent material 26. Since the yellow fluorescent material 22, the green fluorescent material 24 and the red fluorescent material 26 are similar to the previous embodiment in FIGS. 1 and 2, the technical aspect is omitted hereafter.

Therefore, the above emitting light L3 can be applied in lighting and TV backlighting.

More specifically, the radiation source 30 comprises at least one light emitting diode (LED), at least one laser diode (LD), at least one organic light emitting diode (OLED), at least one cold cathode fluorescent lamp (CCFL), or at least one external electrode fluorescent lamp (EEFL).

In order to more clearly explain the aspects of the present invention, especially the overall fluorescent effect on the exciting light L1 with wavelength within 400nm and 460nm by the core-shell fluorescent material 1 comprising the core 10 and the shell 20, some specific examples 1-10 will be described in detail in the following. However, it should be noted that, examples 1-10 are only illustrative, but not intended to limit the scope of the present invention.

First of all, the core-shell fluorescent material 1 used in example 1 primarily comprises the core 10 formed of $Lu_3Al_5O_{12}$:$Ce^{+3}$ and the shell 20 formed of $K_2SiF_6$:$Mn^{+4}$.

Figure 3A:
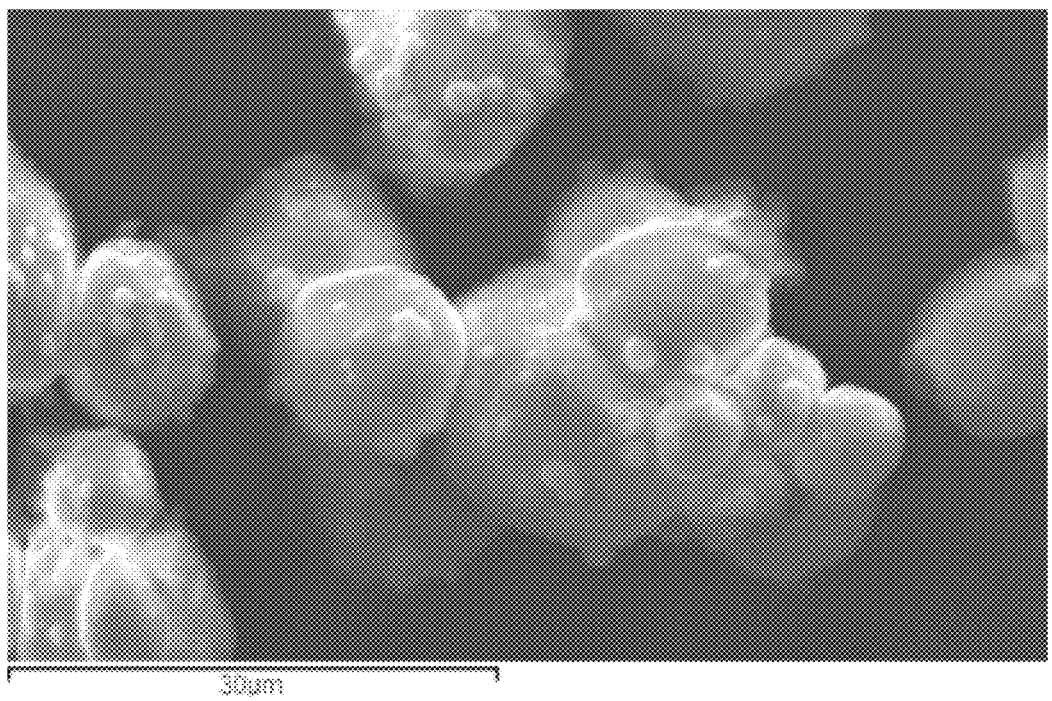
FIG. 3A shows the SEM (scanning electronic microscope) micrograph of the core-shell fluorescent material of the present invention.
Figure 4:
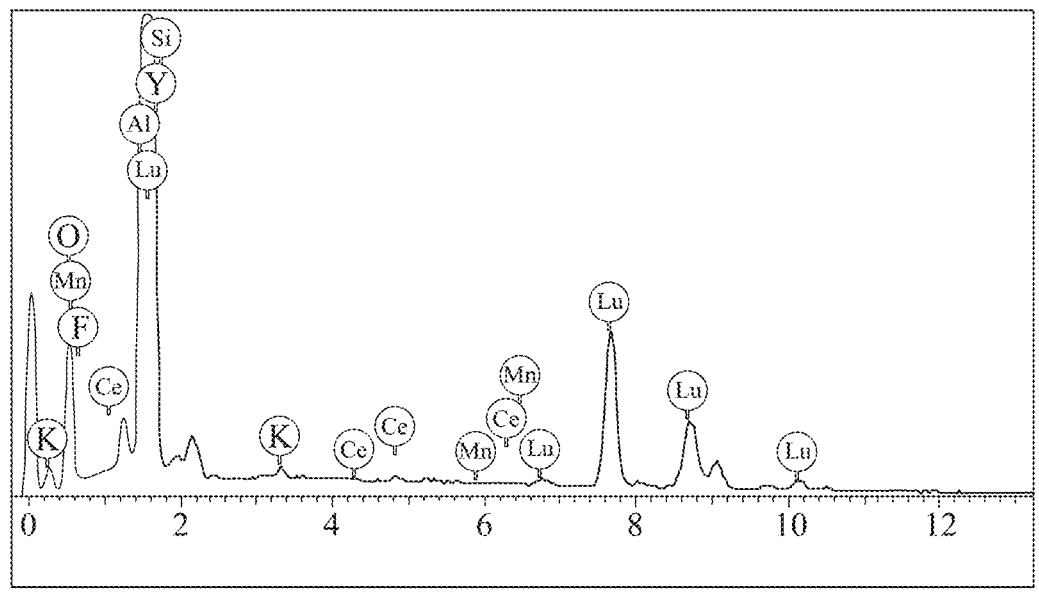
FIG. 4 illustrates the result of element analysis of the core-shell fluorescent material "$Lu_3Al_5O_{12}:Ce^{+3}/K_2SiF_6:Mn^{+4}$" in example 1.
Figure 5:
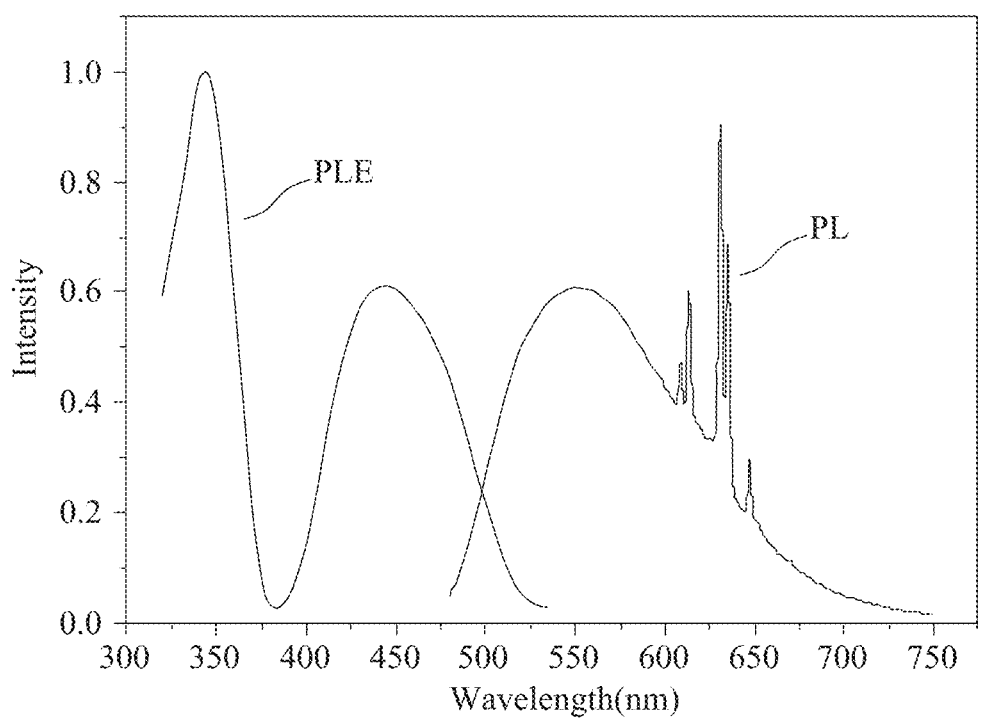
FIG. 5 shows the excitation and emission spectra of the core-shell fluorescent material "$Lu_3Al_5O_{12}:Ce^{+3}/K_2SiF_6:Mn^{+4}$" in example 1.

5-10 g $SiO_2$ was dissolved in 100 mL-1 L HF (hydrogen fluoride) solution, and then 5-10 g $Lu_3Al_5O_{12}:Ce^{+3}$ powder are added. As 20-50 g $KMnO_4$ was dissolved in solution, the color of solution quickly turned to deep purple. Then 10-60 mL $H_2O_2$ was added until core-shell phosphor was formed. Some subsequent tests and analyses are performed, including SEM (scanning electronic microscope) shown in FIG. 3A, the element analysis shown in FIG. 4, and the excitation spectrum PLE and the emission spectrum PL shown in FIG. 5. FIG. 3A shows the core-shell fluorescent material 1 is in a form of irregular particle or powder with a size 15-30 μm. FIG. 4 clearly illustrates the core-shell fluorescent material 1 contains some elements like Lu, Al, O, Ce, K, Si, F and Mn. FIG. 5 shows the spectra of the excitation and the emission for the core-shell fluorescent material $Lu_3Al_5O_{12}:Ce^{+3}/K_2SiF_6:Mn^{+4}$. Specifically, the spectrum of the excitation comprises two peaks within 300-535 nm, which meets commonly used blue LED chip L1 with wavelength within 400-460 nm. In the spectrum of the emission L2 generated by $Lu_3Al_5O_{12}:Ce^{+3}$ and $K_2SiF_6:Mn^{+4}$, the red light component is generated by $K_2SiF_6:Mn^{+4}$ of the shell 20, and has wavelength within 600-700 nm, especially with peak wavelength at 630 nm. That is, it is narrow red light. Therefore, $K_2SiF_6:Mn^{+4}$ is a fluorescent material for highly saturated red light. Additionally, the green light component of the emission spectrum comes from $Lu_3Al_5O_{12}:Ce^{+3}$ of the core 10, and has wavelength within 480-750 nm, especially with peak wavelength at 550 nm. Thus, $Lu_3Al_5O_{12}:Ce^{+3}$ is a fluorescent material for emitting green light.

Figure 6:
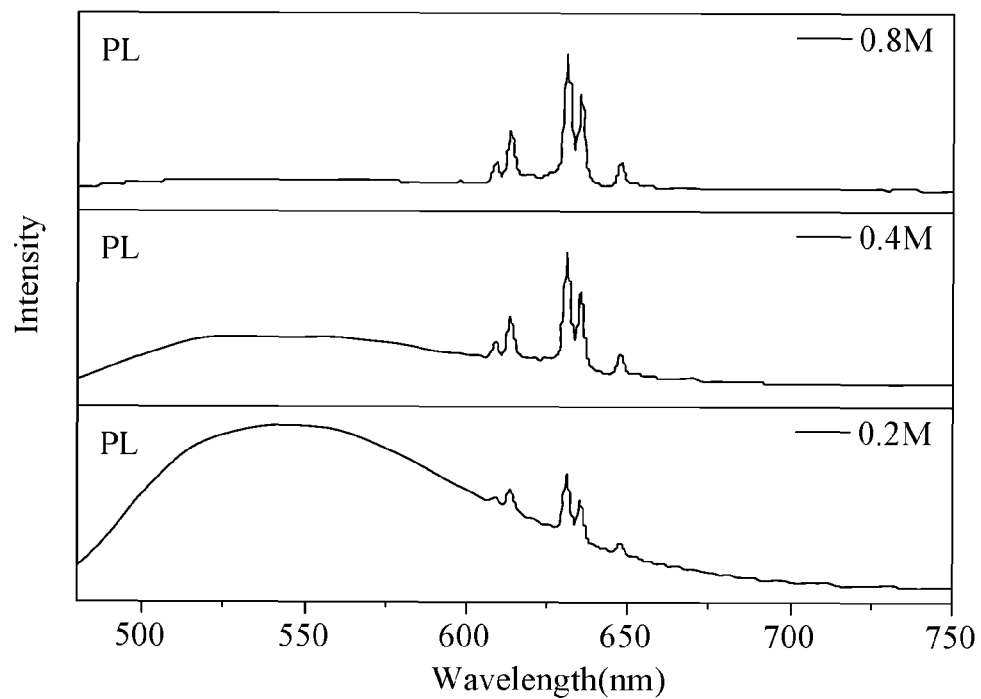
FIG. 6 shows the excitation and emission spectra of the core-shell fluorescent material "$Lu_3Al_5O_{12}:Ce^{+3}/K_2SiF_6:Mn^{+4}$" using the precursor "$K_2SiF_6:Mn^{+4}$" in different concentrations.

Next, FIG. 6 shows the spectra of the emission for the core-shell fluorescent material using the precursor $K_2SiF_6:Mn^{+4}$ in different concentrations 0.2M, 0.4M and 0.8M. As a result, the desired emission can be adjusted by the precursor in different concentrations so as to accord with the requirement of high color rendering by use of only one fluorescent material to collocate the blue light LED.

In example 2, the core 10 is formed of "Beta-SiAlON:$Eu^{+2}$" and the shell 20 is formed of "$K_2SiF_6:Mn^{+4}$". In stoichiometric ratio, 5-10g $SiO_2$ was dissolved in 100 mL-1 L HF (hydrogen fluoride) solution, and then 5-10 g Beta-SiAlON:$Eu^{+2}$ powder are added. As 20-50 g $KMnO_4$ was dissolved in solution, the color of solution quickly turned to deep purple. Then 10-60 mL $H_2O_2$ was added until core-shell phosphor was formed.

Figure 7:
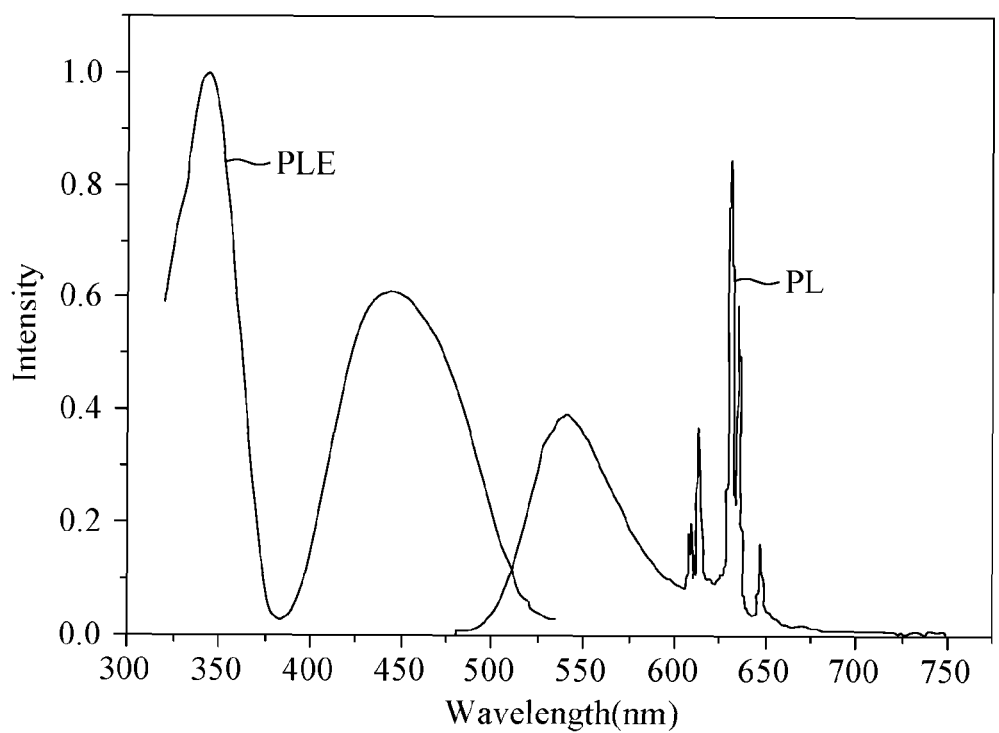
FIG. 7 shows the excitation and emission spectra of the core-shell fluorescent material "Beta-SiAlON/$K_2SiF_6$:$Mn^{+4}$" in example 2.

Some tests and analyses are then performed. FIG. 7 is the spectra of the excitation and the emission for the present core-shell fluorescent material. The corresponding component for the excitation in the spectrum is formed of two peaks with wavelength within 300-535 nm. Accordingly, this excitation is applicable to the traditional blue LED chip with wavelength within 440-460 nm. The component of the emitting light in the spectrum comes from "Beta-SiAlON:$Eu^{+2}$" and "$K_2SiF_6:Mn^{+4}$". More specifically, the red light component is generated by $K_2SiF_6:Mn^{+4}$ of the shell 20, and has wavelength within 600-700 nm, especially with peak wavelength at 630 nm as narrow red light. It is thus a fluorescent material for highly saturated red light. The green light component is generated by Beta-SiAlON:$Eu^{+2}$ of the core 10, and has wavelength within 480-750 nm, especially with peak wavelength at 540 nm. Thus, Beta-SiAlON:$Eu^{+2}$ is a green light material.

Figure 8:
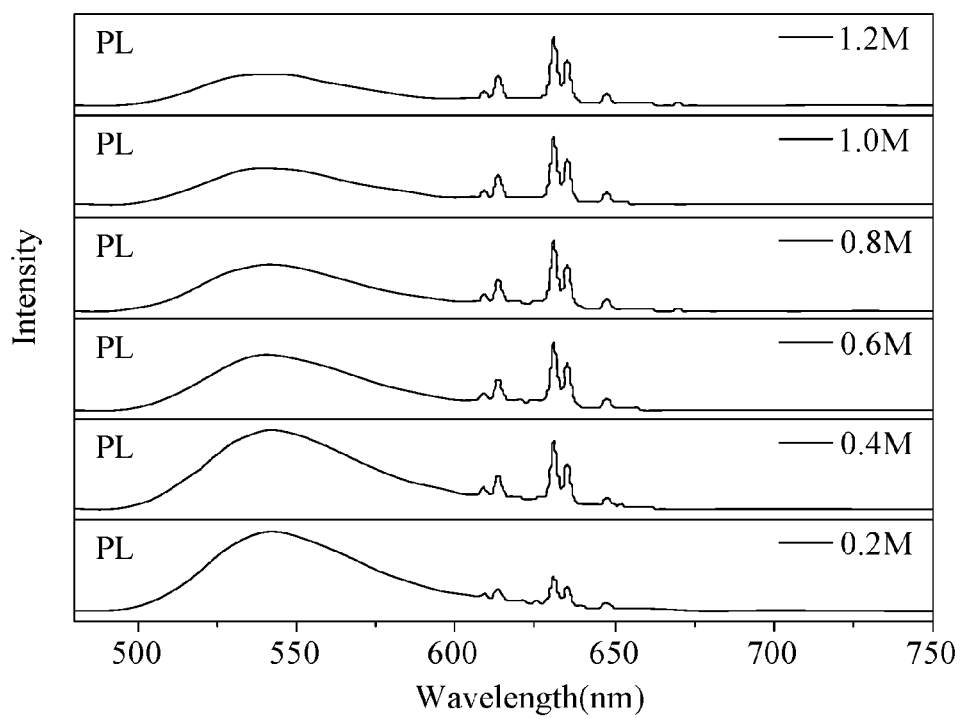
FIG. 8 shows the excitation and emission spectra of the core-shell fluorescent material "Beta-SiAlON/$K_2SiF_6$:$Mn^{+4}$" using the precursor "$K_2SiF_6:Mn^{+4}$" in different concentrations.

In addition, FIG. 8 shows the spectra of the emission for the core-shell fluorescent material using the precursor $K_2SiF_6:Mn^{+4}$" in different concentrations including 0.2M, 0.4M, 0.6M, 0.8M, 1.0M and 1.2M. As a result, the desired emission can be adjusted by the precursor in different concentrations so as to accord with the requirement of high color rendering by use of only one fluorescent material to collocate the blue light LED.

Figure 9:
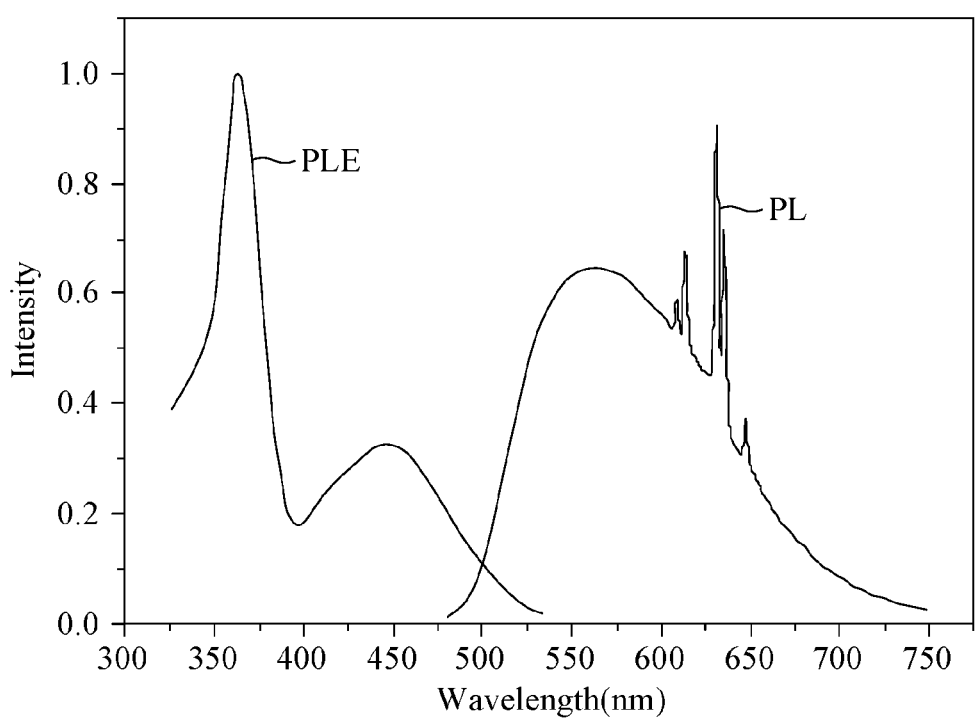
FIG. 9 shows the excitation and emission spectra of the core-shell fluorescent material "$Y_3Al_5O_{12}:Ce^{+3}/K_2SiF_6:Mn^{+4}$" in example 3.

For example 3, the core-shell fluorescent material 1 is formed of "$Y_3Al_5O_{12}:Ce^{+3}/K_2SiF_6:Mn^{+4}$". In stoichiometric ratio, 5-10 g $SiO_2$ was dissolved in 100 mL-1 L HF (hydrogen fluoride) solution, and then 5-10 g $Y_3Al_5O_{12}:Ce^{+3}$ powder are added. As 20-50g $KMnO_4$ was dissolved in solution, the color of solution quickly turned to deep purple. Then 10-60 mL $H_2O_2$ was added until core-shell phosphor was formed. Finally, some tests and analyses are then performed. FIG. 9 shows the spectra of the excitation and the emission for the core-shell fluorescent material $Y_3Al_5O_{12}:Ce^{+3}/K_2SiF_6:Mn^{+4}$. The corresponding component for the excitation in the spectrum is formed of two peaks with wavelength within 300-535 nm. Accordingly, this excitation is applicable to the traditional blue LED chip with wavelength within 440-460 nm. The component of the emission in the spectrum comes from "$Y_3Al_5O_{12}:Ce^{+3}$" and "$K_2SiF_6:Mn^{+4}$". More specifically, the red light component is generated by $K_2SiF_6:Mn^{+4}$ of the shell 20, and has wavelength within 600-700 nm, especially with peak wavelength at 630 nm as narrow red light. It is thus a fluorescent material for highly saturated red light. The yellow light component is generated by $Y_3Al_5O_{12}:Ce^{+3}$ of the core 10, and has wavelength within 480-750 nm, especially with peak wavelength at 560 nm. Thus, $Y_3Al_5O_{12}:Ce^{+3}$ is a yellow light material.

Figure 10:
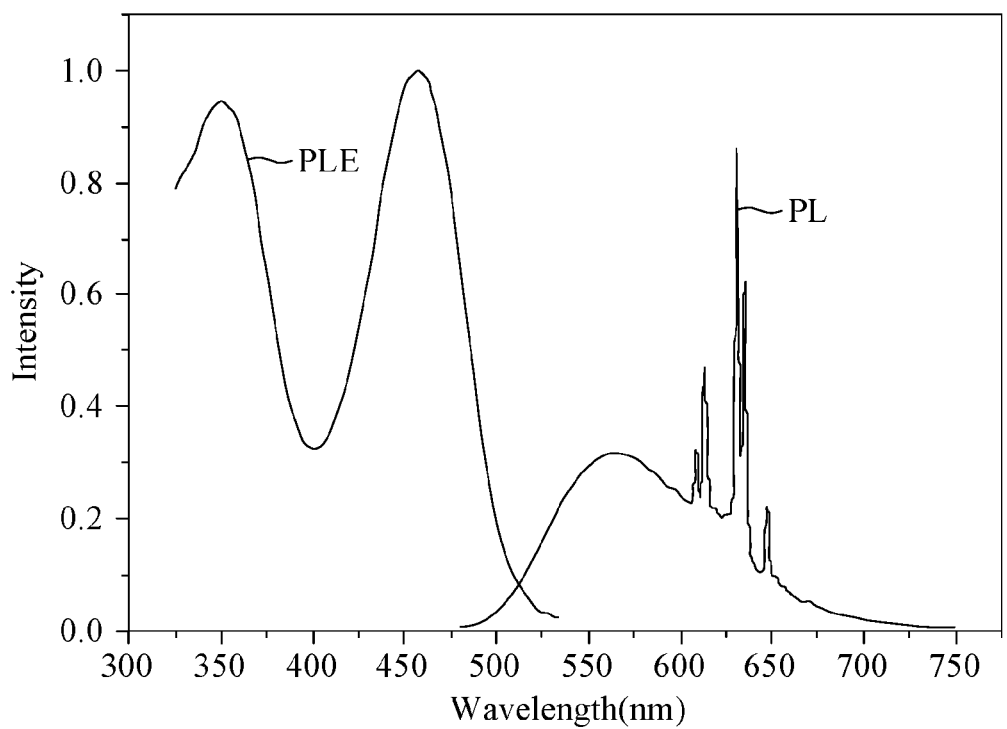
FIG. 10 shows the excitation and emission spectra of the core-shell fluorescent material "$(Ba_{0.09}, Sr_{0.5}, Ca_{04})_2SiO_4$: 0.02 $Eu^{+2}/K_2SiF_6:Mn^{+4}$" in example 4.

The assembly of the core 10 and the shell 20 in example 4 is $(Ba_{0.09}, Sr_{0.5}, Ca_{0.4})_2SiO_4:0.02Eu^{+2}/K_2SiF_6:Mn^{+4}$. In stoichiometric ratio, 5-10 g $SiO_2$ was dissolved in 100 mL-1 L HF (hydrogen fluoride) solution, and then 5-10 g $(Ba_{0.09}, Sr_{0.5}, Ca_{0.4})_2SiO_4:0.02 Eu^{+2}$ powder are added. As 20-50 g $KMnO_4$ was dissolved in solution, the color of solution quickly turned to deep purple. Then 10-60 mL $H_2O_2$ was added until core-shell phosphor was formed.FIG. 10 is the spectra of the excitation and the emission for the present core-shell fluorescent material $(Ba_{0.09}, Sr_{0.5}, Ca_{0.4})_2SiO_4:0.02 Eu^{+2}/K_2SiF_6:Mn^{+4}$. The corresponding component for the excitation in the spectrum is formed of two peaks with wavelength within 300-535 nm.

Accordingly, this excitation is applicable to the traditional blue LED chip with wavelength within 440-460 nm. The component of the emission in the spectrum comes from $(Ba_{0.09}, Sr_{0.5}, Ca_{0.4})_2SiO_4:0.02 Eu^{+2}$ and $K_2SiF_6:Mn^{+4}$. The red light component is generated by $K_2SiF_6:Mn^{+4}$ of the shell 20, and has wavelength within 600-700 nm, especially with peak wavelength at 630 nm as narrow red light. It is thus a fluorescent material for highly saturated red light. The yellow light component is generated by $(Ba_{0.09}, Sr_{0.5}, Ca_{0.4})_2SiO_4:0.02 Eu^{+2}$ of the core 10, and has wavelength within 480-750 nm, especially with peak wavelength at 570 nm. Thus, $(Ba_{0.09}, Sr_{0.5}, Ca_{0.4})_2SiO_4:0.02 Eu^{+2}$ is a yellow light material.

Figure 11:
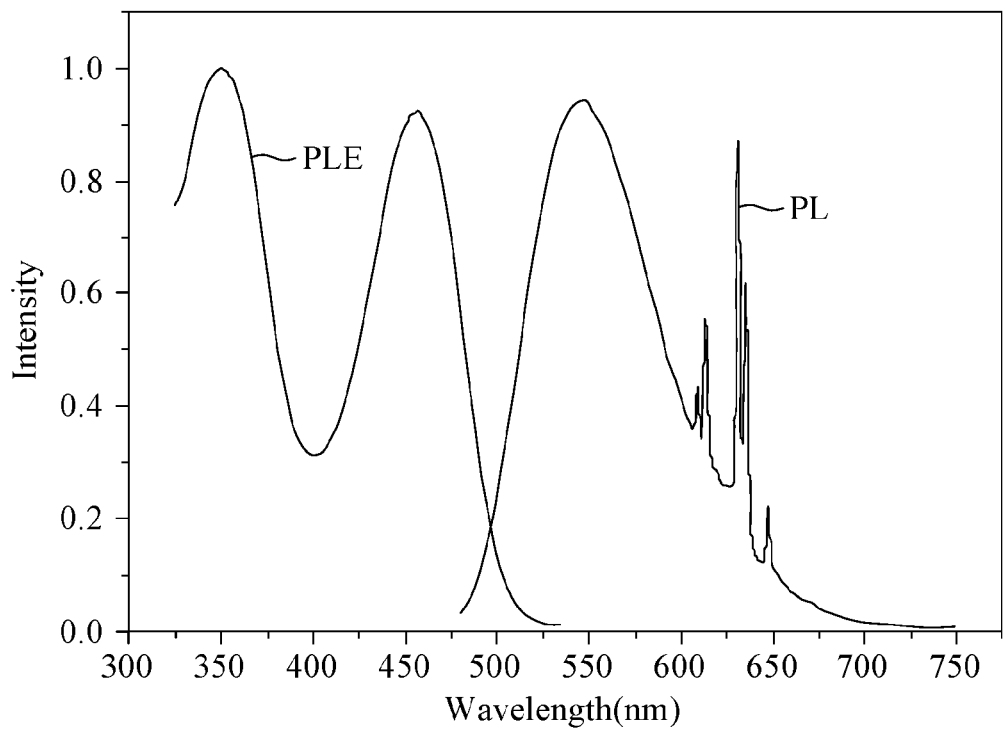
FIG. 11 shows the excitation and emission spectra of the core-shell fluorescent material "$(Sr_{0.8}, Ca_{0.19})Si_2O_2N_2N_2$: 0.01 $Eu^{+2}/K_2SiF_6:Mn^{+4}$" in example 5.

In example 5, the assembly of the core 10 and the shell 20 is $(Sr_{0.8}, Ca_{0.19})Si_2O_2N_2:0.01 Eu^{+2}/K_2SiF_6:Mn^{+4}$. In stoichiometric ratio, 5-10 g $SiO_2$ was dissolved in 100 mL-1 L HF (hydrogen fluoride) solution, and then 5-10 g $(Sr_{0.8}, Ca_{0.19})Si_2O_2N_2:0.01 Eu^{+2}$ powder are added. As 20-50 g $KMnO_4$ was dissolved in solution, the color of solution quickly turned to deep purple. Then 10-60 mL $H_2O_2$ was added until core-shell phosphor was formed.FIG. 11 is the spectra of the excitation and the emission for the present core-shell fluorescent material $(Sr_{0.8}, Ca_{0.19})Si_2O_2N_2:0.01 Eu^{+2}/K_2SiF_6:Mn^{+4}$. The corresponding component for the excitation in the spectrum is formed of two peaks with wavelength within 300-535 nm. Accordingly, this excitation is applicable to the traditional blue LED chip with wavelength within 440-460 nm. The component of the emission in the spectrum comes from $(Sr_{0.8}, Ca_{0.19})Si_2O_2N_2:0.01$ $Eu^{+2}$ and $K_2SiF_6:Mn^{+4}$. The red light component is generated by $K_2SiF_6:Mn^{+4}$ of the shell 20, and has wavelength within 600-700 nm, especially with peak wavelength at 630 nm as narrow red light. It is thus a fluorescent material for highly saturated red light. The green light component is generated by $(Si_{0.8}, Ca_{0.19})Si_2O_2N_2:0.01Eu^{+2}$ of the core 10, and has wavelength within 480-750 nm, especially with peak wavelength at 545 nm. Thus, $(Sr_{0.8}, Ca_{0.19})Si_2O_2N_2:$ $0.01\ Eu^{+2}$ is a Green light material.

Figure 12:
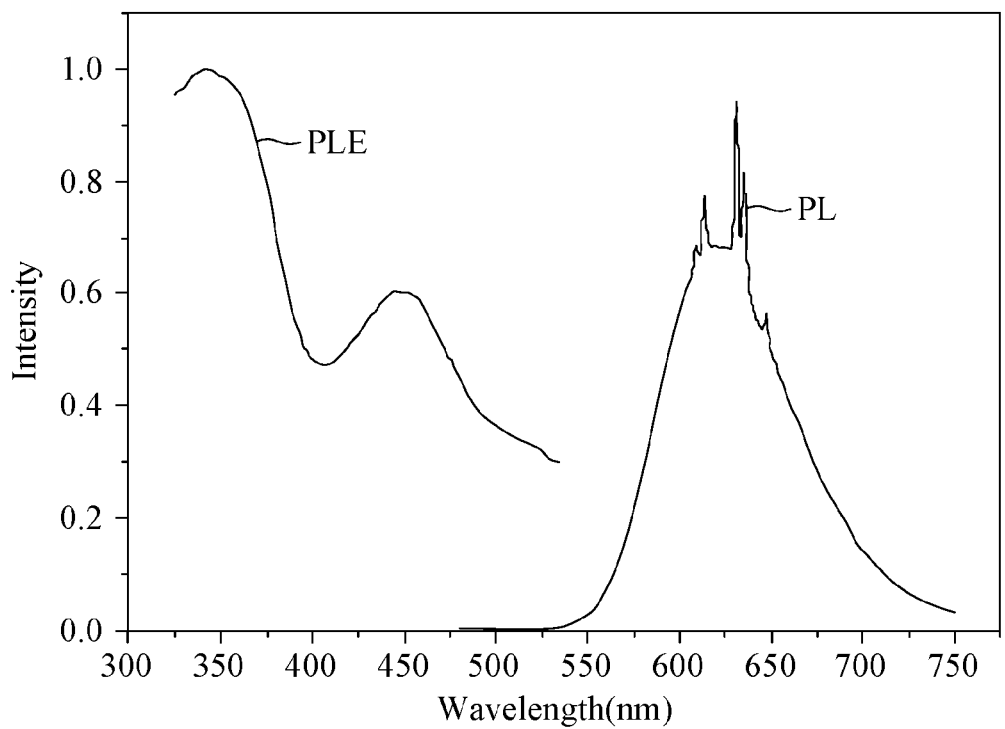
FIG. 12 shows the excitation and emission spectra of the core-shell fluorescent material "$(Ca_{0.4}, Sr_{0.3}, Ba_{0.29})_2Si_5N_8$: 0.02 $Eu^{+2}/K_2SiF_6:Mn^{+4}$" in example 6.

In example 6, the assembly of the core 10 and the shell 20 is $(Ca_{0.4},\ Sr_{0.3},\ Ba_{0.29})Si_5N_8:0.02\ Eu^{+2}/K_2SiF_6:Mn^{4+}$. In stoichiometric ratio, 5-10 g $SiO_2$ was dissolved in 100 mL-1 L HF (hydrogen fluoride) solution, and then 5-10 g $(Ca_{0.4}, Sr_{0.3}, Ba_{0.29})_2Si_5N_8:0.02Eu_{+2}$ powder are added. As 20-50 g $KMnO_4$ was dissolved in solution, the color of solution quickly turned to deep purple. Then 10-60 mL $H_2O_2$ was added until core-shell phosphor was formed. FIG. 12 is the spectra of the excitation and the emission for the present core-shell fluorescent material $(Ca_{0.4}, Sr_{0.3}, Ba_{0.29})_2Si_5N_8:$ $0.02\ Eu^{+2}/K_2SiF_6:Mn^{+4}$. The corresponding component for the excitation in the spectrum is formed of two peaks with wavelength within 300-535 nm. Accordingly, this excitation is applicable to the traditional blue LED chip with wavelength within 440-460 nm. The component of the emission in the spectrum comes from $(Ca_{0.4}, Sr_{0.3}, Ba_{0.29})_2Si_5N_8:0.02$ $Eu^{+2}$ and $K_2SiF_6:Mn^{+4}$, and has wavelength within 500-750 nm, especially with peak wavelength at 630 nm.

In example 7, the assembly of the core 10 and the shell 20 is $(Ca_{0.5}, Sr_{0.49})AlSiN_3:0.01\ Eu^{+2}/K_2SiF_6:Mn^{4+}$. In stoichiometric ratio, 5-10 g $SiO_2$ was dissolved in 100 mL-1 L HF (hydrogen fluoride) solution, and then 5-10g $(Ca_{0.5}, Sr_{0.49})AlSiN_3:0.01\ Eu^{+2}$ powder are added. As 20-50 g $KMnO_4$ was dissolved in solution, the color of solution quickly turned to deep purple.

Figure 13:
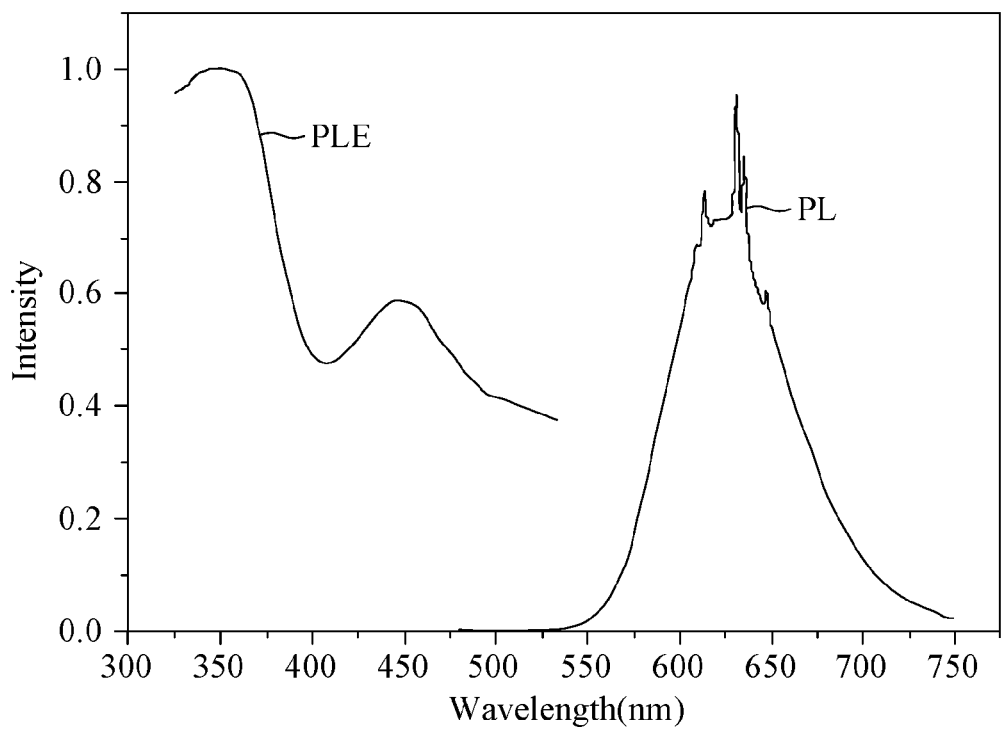
FIG. 13 shows the excitation and emission spectra of the core-shell fluorescent material "$(Ca_{0.5}, Sr_{0.49})AlSiN_3$:0.01 $Eu^{+2}/K_2SiF_6:Mn^{+4}$" in example 7.

Then 10-60 mL $H_2O_2$ was added until core-shell phosphor was formed. FIG. 13 is the spectra of the excitation and the emission for the present core-shell fluorescent material $(Ca_{0.5}, Sr_{0.49})AlSiN_3:0.01\ Eu^{+2}/K_2SiF_6:Mn^{+4}$. The corresponding component for the excitation in the spectrum is formed of two peaks with wavelength within 300-535 nm. Accordingly, this excitation is applicable to the traditional blue LED chip with wavelength within 440-460 nm. The component of the emission in the spectrum comes from $(Ca_{0.5}, Sr_{0.49})AlSiN_3:0.01\ Eu^{+2}$ and $K_2SiF_6:Mn^{+4}$, and has wavelength within 500-750nm, especially with peak wavelength at 630 nm.

For example 8, the assembly of $(Lu_3Al_5O_{12}:Ce^{+3}/K_2SiF_6:$ $Mn^{4+})$ is packaged. Table 1 shows the test result for the fluorescent materials in the above examples after being packaged. Comparative examples 1-5 are implemented by using single fluorescent powder, and the 460 nm blue LED chip is used to collocate $Lu_3Al_5O_{12}:Ce^{+3}$, $Y_3Al_5O_{12}:Ce^{+3}$, $(Sr_{0.8}, Ca_{0.19})Si_2O_2N_2:0.01\ Eu^{+2}(Ba_{0.09}, Sr_{0.5}, Ca_{0.4})_2SiO_4:$ $0.02\ Eu^{+2}$ and Beta-SiAlON:$Eu^{+2}$, respectively. However, example 8 is packaged by employing the core-shell fluorescent material $Lu_3Al_5O_{12}:Ce^{+3}/K_2SiF_6:Mn^{+4}$ manufactured in example 1 and the 460 nm blue LED chip.

TABLE 1

| | assembly | CRI |
|---|---|---|
| Comparative example 1 | 460 nm blue LED chip + $Lu_3Al_5O_{12}:Ce^{+3}$ fluorescent powder | 72 |
| Comparative example 2 | 460 nm blue LED chip + $Y_3Al_5O_{12}:Ce^{+3}$ fluorescent powder | 75 |
| Comparative example 3 | 460 nm blue LED chip + $(Sr_{0.8}, Ca_{0.19})Si_2O_2N_2:0.01Eu^{+2}$ fluorescent powder | 68 |
| Comparative example 4 | 460 nm blue LED chip + $(Ba_{0.09}, Sr_{0.5}, Ca_{0.4})_2SiO_4:0.02Eu^{+2}$ fluorescent powder | 72 |
| Comparative example 5 | 460 nm blue LED chip + Beta-SiAlON:$Eu^{+2}$ fluorescent powder | 60 |
| Example 8 | 460 nm blue LED chip + $Lu_3Al_5O_{12}:Ce^{+3}/K_2SiF_6:Mn^{+4}$ | 80 |

As a result, the packages of comparative examples 1-5 have color rendering index (CRI) within 60-75, but the package using the core-shell fluorescent material $Lu_3Al_5O_{12}:Ce^{+3}/K_2SiF_6:Mn^{+4}$ as a single one fluorescent powder can improve CRI up to 80.

Additionally, example 9 employs the core-shell fluorescent material $(Ca_{0.4}, Sr_{0.3}, Ba_{0.29})_2Si_5N_8:0.02\ Eu^{+2}/K_2SiF_6:$ $Mn^{+4}$, and the result is shown in Table 2.

TABLE 2

| | assembly | CRI |
|---|---|---|
| Comparative example 6 | 460 nm blue LED chip + $Lu_3Al_5O_{12}:Ce^{+3}$ fluorescent powder + $(Ca_{0.4},Sr_{0.3},Ba_{0.29})_2Si_5N_8:0.02Eu^{+2}$ fluorescent powder | 84 |
| Example 9 | 460 nm blue LED chip + $Lu_3Al_5O_{12}:Ce^{+3}$ fluorescent powder + $(Ca_{0.4},Sr_{0.3},Ba_{0.29})_2Si_5N_8:0.02Eu^{+2}/K_2SiF_6:Mn^{+4}$ | 87 |

In Table 2, comparative example 6 uses the 460nm blue LED chip collocating $Lu_3Al_5O_{12}:Ce^{+3}$ fluorescent powder and $(Ca_{0.4}, Sr_{0.3}Ba_{0.29})_2Si_5N_8:0.02Eu^{+2}$ fluorescent powder so as to perform packaging. Example 9 uses the core-shell fluorescent material $(Ca_{0.4}Sr_{0.3}Ba_{0.29})_2Si_5N_8:0.02\ Eu^{+2}/$ $K_2SiF_6:Mn^{+4}$ manufactured in example 6, which collocates $Lu_3Al_5O_{12}:Ce^{+3}$ fluorescent powder and the 460nm blue LED chip, so as to perform packaging. The result shows that the package of comparative examples 6 has color rendering index (CRI) 84, but the package using the core-shell fluorescent material $(Ca_{0.4}, Sr_{0.3}, Ba_{0.29})_2Si_5N_8:0.02Eu^{+2}/$ $K_2SiF_6:Mn^{+4}$ and $Lu_3Al_5O_{12}:Ce^{+3}$ fluorescent powder can increase CRI up to 87. Therefore, the core-shell fluorescent material $(Ca_{0.4}, Sr_{0.3}, Ba_{0.29})_2Si_5N_8:0.02\ Eu^{+2}/K_2SiF_6:$ $Mn^{+4}$ can greatly increase CRI.

Finally, example 10 shows the result for the core-shell fluorescent material $(Ca_{0.5}, Sr_{0.49})AlSiN_3:0.01\ Eu^{+2}/$ $K_2SiF_6:Mn^{+4}$, as shown in Table 3.

TABLE 3

| | assembly | CRI |
|---|---|---|
| Comparative example 7 | 460 nm blue LED chip + $Lu_3Al_5O_{12}:Ce^{+3}$ fluorescent powder + $(Ca_{0.5},Sr_{0.49})AlSiN_3:0.01Eu^{+2}$ fluorescent powder | 85 |
| Example 10 | 460 nm blue LED chip + $Lu_3Al_5O_{12}:Ce^{+3}$ fluorescent powder + $(Ca_{0.5}, Sr_{0.49})AlSiN_3:0.01Eu^{+2}/K_2SiF_6:Mn^{+4}$ | 88 |

Comparative example 7 uses the 460nm blue LED chip collocating $Lu_3Al_5O_{12}:Ce^{+3}$ fluorescent powder and $(Ca_{0.5}$ $Sr_{0.49})AlSiN_3:0.01\ Eu^{+2}$ fluorescent powder so as to perform packaging. Example 10 uses the core-shell fluorescent material $(Ca_{0.5}\ Sr_{0.49})AlSiN_3:0.01\ Eu^{+2}/K_2SiF_6:Mn^{+4}$ manufactured in example 7, which collocates $Lu_3Al_5O_{12}:Ce^{+3}$ fluorescent powder and the 460nm blue chip, so as to perform packaging. The result shows that the package of comparative examples 7 has CRI 85, but the package using the core-shell fluorescent material $(Ca_{0.5} Sr_{0.49})AlSiN_3:0.01\ Eu^{+2}/K_2SiF_6:Mn^{+4}$ fluorescent powder can increase CRI up to 88. Therefore, the core-shell fluorescent material $(Ca_{0.5}, Sr_{0.49})AlSiN_3:0.01\ Eu^{+2}/K_2SiF_6:Mn^{+4}$ can greatly increase CRI.

From the above mention, one primary feature of the present invention is that the core-shell fluorescent material comprising the core and the shell can afford to adjust the fluorescent effect, particularly, the core comprising yellow light, green light or red light fluorescent powder, and the shell comprising manganese (IV)-doped fluoride compound. Moreover, the present invention may further comprise at least one of yellow light, green light or red light fluorescent materials for receiving the excitation and emission yellow light, green light or red light, respectively, so as to adjust the resultant emission having the specific hybrid spectrum as high quality color light like white light. Additionally, another aspect of the present invention is that the core-shell fluorescent material is used to manufacture the light source device having high color rendering index for providing the desired light source for lighting and TV backlighting.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A core-shell fluorescent material that emits light having a peak wavelength ranging from 520 to 800 nm when excited by visible light ranging from 400 to 460 nm, comprising:

a core material comprising at least one of yellow, green and red fluorescent powder; and a shell material that is coated on the core material and that comprises a manganese (IV)-doped fluoride compound specified by a chemical formula $A_xMF_{6-y}Z_y:Mn^{4+}$ to provide said core-shell fluorescent material, wherein, when x=1, 0 ≤y≤6, A is at least one of Mg, Ca, Sr, Ba , or combinations thereof and, when x=2, 0 ≤y≤6, A is at least one of Li, Na, K, Rb, Cs , or combinations thereof, M is selected from Si, Ge, Sn, Ti, Zr, Al, Ga, In, Sc, Y, La, Nb, Ta, Bi, Gd , or combinations thereof, F is fluorine, Z is at least one of Cl, Br, I, or combinations thereof, and $Mn^{4+}$ represents the tetravalent manganese ion.

2. The core-shell fluorescent material as claimed in claim 1, wherein the core material has a particle size ranging from 0.01 μm to 200 μm.

3. The core-shell fluorescent material as claimed in claim 1, wherein the at least one of yellow, green and red fluorescent powder of the core material comprises one of (a) a trivalent cerium - doped ($Ce^{+3}$) metal oxide having a chemical formula $(Y, Gd, Tb, La, Sm, Pr, Lu)_3(Sc, Al, Ga)_5O_{12}:Ce^{+3}$, and (b) a divalent europium-doped ($Eu^{+2}$) compound comprising one of $(Sr, Ca)Si_2O_2N_2:Eu^{+2}$, Alpha-SiAlON:$Eu^{+2}$, Beta-SiAlON:$Eu^{+2}$, $(Ba, Sr, Ca)_2SiO_4:Eu^{+2}$, $(Ba, Sr, Ca)_2Si_5N_8:Eu^{+2}$, and $(Ca, Sr)AlSiN_3:Eu^{+2}$.

4. A light source device including the core-shell fluorescent material according to claim 1, comprising:

a radiation source that emits radiation having a wavelength ranging from 400 to 460 nm;

a plurality of leads that provide current to the radiation source and cause the radiation source to emit radiation;

a package that encloses and protects the radiation source and at least a portion of the plurality of leads; and a coating that is provided on a surface of the package, that is comprised of the core-shell fluorescent material, that receives radiation from the radiation source in use and generates and emits light having a pre-determined spectrum.

5. The light source device as claimed in claim 4, wherein the radiation source comprises at least one light emitting diode (LED), at least one laser diode (LD), and at least one organic light emitting diode (OLED).

6. The light source device as claimed in claim 4, wherein said yellow fluorescent powder is at least one material selected from the group consisting of $Y_3Al_5O_{12}:Ce^{+3}$, Alpha-SiAlON:$Eu^{+2}$, and $(Ba, Sr, Ca)_2SiO_4:Eu^{+2}$; the green fluorescent powder is at least one material selected from the group consisting of $Lu_3Al_5O_{12}:Ce^{+3}$, Beta-SiAlON:$Eu^{+2}$, and $(Sr, Ca)Si_2O_2N_2:Eu^{+2}$, and the red fluorescent powder comprises at least one of $(Ba, Sr, Ca)_2Si_5N_8:Eu^{+2}$ and $(Ca, Sr)AlSiN_3:Eu^{+2}$.

* * * * *